(12) United States Patent
Huang

(10) Patent No.: US 12,483,260 B2
(45) Date of Patent: Nov. 25, 2025

(54) OPERATION STAGE OF PIPELINE ANALOG-TO-DIGITAL CONVERTER AND ANALOG-TO-DIGITAL CONVERTER THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 92 days.

(21) Appl. No.: 18/654,022

(22) Filed: May 3, 2024

(65) Prior Publication Data
US 2024/0380407 A1   Nov. 14, 2024

(30) Foreign Application Priority Data
May 10, 2023   (TW) .................................. 112117356

(51) Int. Cl.
*H03M 1/12*   (2006.01)
*H03M 1/44*   (2006.01)

(52) U.S. Cl.
CPC ......... *H03M 1/1205* (2013.01); *H03M 1/442* (2013.01)

(58) Field of Classification Search
None
See application file for complete search history.

(56) References Cited

U.S. PATENT DOCUMENTS

| | | | | |
|---|---|---|---|---|
| 6,304,199 B1* | 10/2001 | Fang | ................... | H03M 1/0624 341/118 |
| 6,816,100 B1* | 11/2004 | Galton | ............... | H03M 1/0682 341/143 |
| 7,501,970 B2* | 3/2009 | Trifonov | ............... | H03M 1/682 341/145 |

(Continued)

OTHER PUBLICATIONS

OA letter of a counterpart TW application (appl. No. 112117356) mailed on Feb. 29, 2024. Summary of the TW OA letter: (1) Claim(s) 1-2 and 9-10 is/are rejected under Patent Law Article 22(2) as allegedly being unpatentable over reference 1 (U.S. Pat. No. 10,911,058 B2) and reference 2 (Haideh Khorramabadi). Claim correspondence between the TW counterpart application and the instant US application: Claims 1-10 in the TW counterpart application correspond to claims 1-10 in the instant US application, respectively.

(Continued)

*Primary Examiner* — Muhammad Adnan
(74) *Attorney, Agent, or Firm* — WPAT, PC

(57) ABSTRACT

An ADC receives a first input signal and a second input signal and outputs a digital signal. The first input signal is a common-mode voltage plus a voltage difference, and the second input signal is the common-mode voltage minus the voltage difference. The ADC includes a voltage conversion circuit and multiple comparators. The voltage conversion circuit generates an intermediate voltage according to the first input signal, the second input signal, and the common-mode voltage. The comparators compare the intermediate voltage with N times a reference voltage, where N is greater than or equal to negative one and less than or equal to one. The intermediate voltage is the common-mode voltage plus or minus M times the voltage difference, where M is two to the power of R, and R is a positive integer.

16 Claims, 9 Drawing Sheets

(56) References Cited

U.S. PATENT DOCUMENTS

| | | | |
|---|---|---|---|
| 9,854,357 B1* | 12/2017 | Das | H03F 1/34 |
| 10,027,342 B1* | 7/2018 | Chen | H03M 1/167 |
| 10,084,467 B1* | 9/2018 | Chang | H03M 1/38 |
| 10,911,058 B2 | 2/2021 | Moore | |
| 12,418,293 B2* | 9/2025 | Huang | H03K 19/1737 |
| 2004/0066232 A1* | 4/2004 | Mouret | H03G 7/08 |
| | | | 330/254 |
| 2007/0030191 A1* | 2/2007 | Muramatsu | H03M 1/46 |
| | | | 341/155 |
| 2011/0227774 A1* | 9/2011 | Cho | H03M 1/0678 |
| | | | 341/172 |
| 2013/0002466 A1* | 1/2013 | Bae | H03M 1/141 |
| | | | 341/158 |
| 2015/0194981 A1* | 7/2015 | Tang | H03M 1/0609 |
| | | | 341/172 |
| 2016/0329906 A1* | 11/2016 | Patukuri | G01S 17/894 |
| 2018/0019761 A1* | 1/2018 | Coln | H03M 1/1245 |
| 2018/0041221 A1* | 2/2018 | Xu | H03M 1/069 |
| 2018/0269893 A1* | 9/2018 | Chang | H03M 1/0682 |
| 2024/0291502 A1* | 8/2024 | Chen | H03M 3/494 |
| 2024/0380407 A1* | 11/2024 | Huang | H03M 1/1205 |
| 2024/0413832 A1* | 12/2024 | Yang | H03M 1/0697 |

OTHER PUBLICATIONS

Haideh Khorramabadi "EE247 Lecture 23" (https://inst.eecs.berkeley.edu/~ee247/fa08/files07/lectures/L23_f08.pdf), 2008.

* cited by examiner

OPERATION STAGE OF PIPELINE ANALOG-TO-DIGITAL CONVERTER AND ANALOG-TO-DIGITAL CONVERTER THEREOF

BACKGROUND OF THE INVENTION

1. Field of the Invention

The present invention generally relates to a pipeline analog-to-digital converter (pipeline ADC, also referred to as pipelined ADC), and, more particularly, to an operation stage of the pipeline ADC and its analog-to-digital converter (ADC).

2. Description of Related Art

Analog-to-digital converters (ADCs) are used in a wide range of applications. With the advancement of technology, the demand for ADCs in electronic devices is also increasing. Therefore, improving the resolution and signal-to-noise ratio (SNR) of ADCs has become an important topic in this field.

SUMMARY OF THE INVENTION

In view of the issues of the prior art, an object of the present invention is to provide an operation stage of a pipeline analog-to-digital converter (pipeline ADC) and its analog-to-digital converter (ADC), so as to make an improvement to the prior art.

According to one aspect of the present invention, an operation stage of a pipeline ADC is provided. The operation stage is configured to generate a first output signal and a second output signal according to a first input signal and a second input signal. The first input signal is a common-mode voltage plus a voltage difference, and the second input signal is the common-mode voltage minus the voltage difference. The operation stage includes a voltage conversion circuit, a plurality of comparators, a multiplexer, and a multiplication circuit. The voltage conversion circuit is configured to generate an intermediate voltage according to the first input signal, the second input signal, and the common-mode voltage. The plurality of comparators is configured to compare the intermediate voltage with N times a first reference voltage to generate a digital signal. N is greater than or equal to negative one and less than or equal to one. The multiplexer is coupled to the comparators and configured to generate a second reference voltage and a third reference voltage according to the digital signal. The multiplication circuit is configured to generate the first output signal and the second output signal according to the first input signal, the second input signal, the second reference voltage, and the third reference voltage. The intermediate voltage is the common-mode voltage plus M times the voltage difference or the common-mode voltage minus M times the voltage difference. M is two to the power of R, and R is a positive integer.

According to another aspect of the present invention, an ADC is provided. The ADC is configured to receive a first input signal and a second input signal and output a digital signal. The first input signal is a common-mode voltage plus a voltage difference, and the second input signal is the common-mode voltage minus the voltage difference. The ADC includes a voltage conversion circuit and a plurality of comparators. The voltage conversion circuit is configured to generate an intermediate voltage according to the first input signal, the second input signal, and the common-mode voltage. The plurality of comparators is configured to compare the intermediate voltage with N times a reference voltage. N is greater than or equal to negative one and less than or equal to one. The intermediate voltage is the common-mode voltage plus M times the voltage difference or the common-mode voltage minus M times the voltage difference. M is two to the power of R, and R is a positive integer.

The technical means embodied in the embodiments of the present invention can solve at least one of the problems of the prior art. Therefore, compared to the prior art, the present invention can improve the resolution and signal-to-noise ratio (SNR) of the ADC.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an operation stage of a pipeline analog-to-digital converter (pipeline ADC) and its analog-to-digital converter (ADC). On account of that some or all elements of the pipeline ADC and the ADC could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
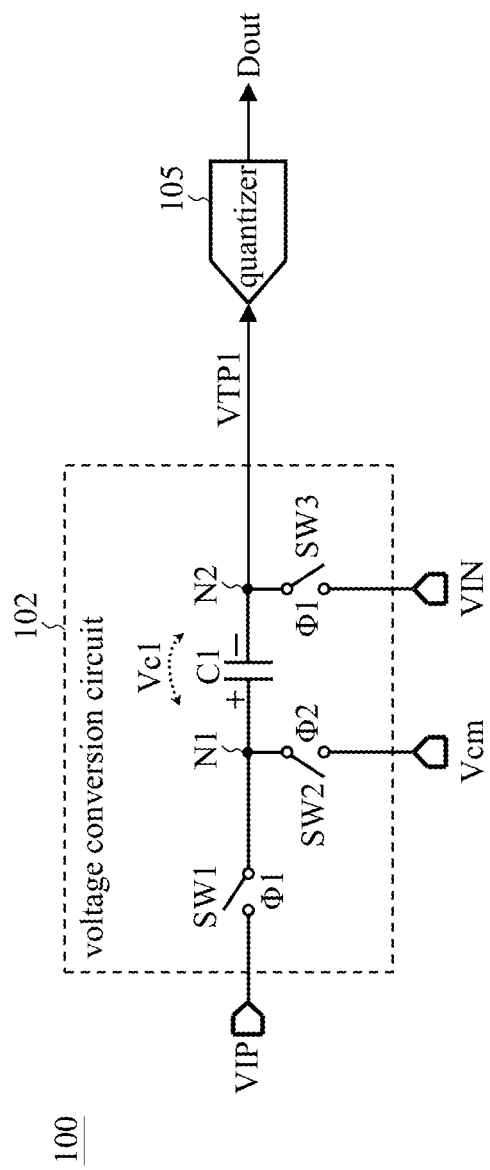
FIG. 1 is a circuit diagram of an analog-to-digital converter (ADC) according to an embodiment of the present invention.

FIG. 1 is a circuit diagram of an analog-to-digital converter (ADC) according to an embodiment of the present invention. The ADC 100 includes a voltage conversion circuit 102 and a quantizer 105. The voltage conversion circuit 102 includes a capacitor C1, a switch SW1, a switch SW2, and a switch SW3. The two terminals of the capacitor C1 are the node N1 and the node N2 respectively.

The ADC 100 generates the digital signal Dout according to the input signal VIP, the input signal VIN, and the common-mode voltage Vcm. The input signal VIP and the input signal VIN are a differential signal pair, and the common-mode voltage Vcm is the common-mode voltage of the input signal VIP and the input signal VIN. In other words, the input signal VIP is the common-mode voltage Vcm plus a voltage difference dV (i.e., VIP=Vcm+dV), and the input signal VIN is the common-mode voltage Vcm minus the voltage difference dV (i.e., VIN=Vcm−dV). In other words, the voltage difference dV is the signal component of the differential signal pair.

One terminal of the switch SW1 receives the input signal VIP; the other terminal of the switch SW1 is coupled or electrically connected to the node N1.

One terminal of the switch SW2 receives the common-mode voltage Vcm; the other terminal of the switch SW2 is coupled or electrically connected to the node N1.

One terminal of the switch SW3 receives the input signal VIN; the other terminal of the switch SW3 is coupled or electrically connected to the node N2.

The input terminal of the quantizer 105 is coupled or electrically connected to the node N2. The quantizer 105 generates the digital signal Dout according to at least the intermediate voltage VTP1 at the node N2.

The ADC 100 operates according to a clock. In the first phase of the clock (e.g., high level), the switch SW1 and the switch SW3 are turned on (corresponding to the phase "Φ1" in the figure), and the switch SW2 is turned off, causing the voltage Vc1 across the capacitor C1 to become VIP−VIN=2 dV.

In the second phase of the clock (e.g., low level), the switch SW1 and the switch SW3 are turned off, and the switch SW2 is turned on (corresponding to the phase "Φ2" in the figure), causing the intermediate voltage VTP1 at the node N2 to become Vcm−2 dV. As a result, the quantizer 105 substantially quantizes twice the signal component (i.e., the voltage difference dV) of the differential signal pair; therefore, the resolution and SNR of the ADC 100 can be improved (e.g., the SNR is increased by 6 dB).

Figure 2:
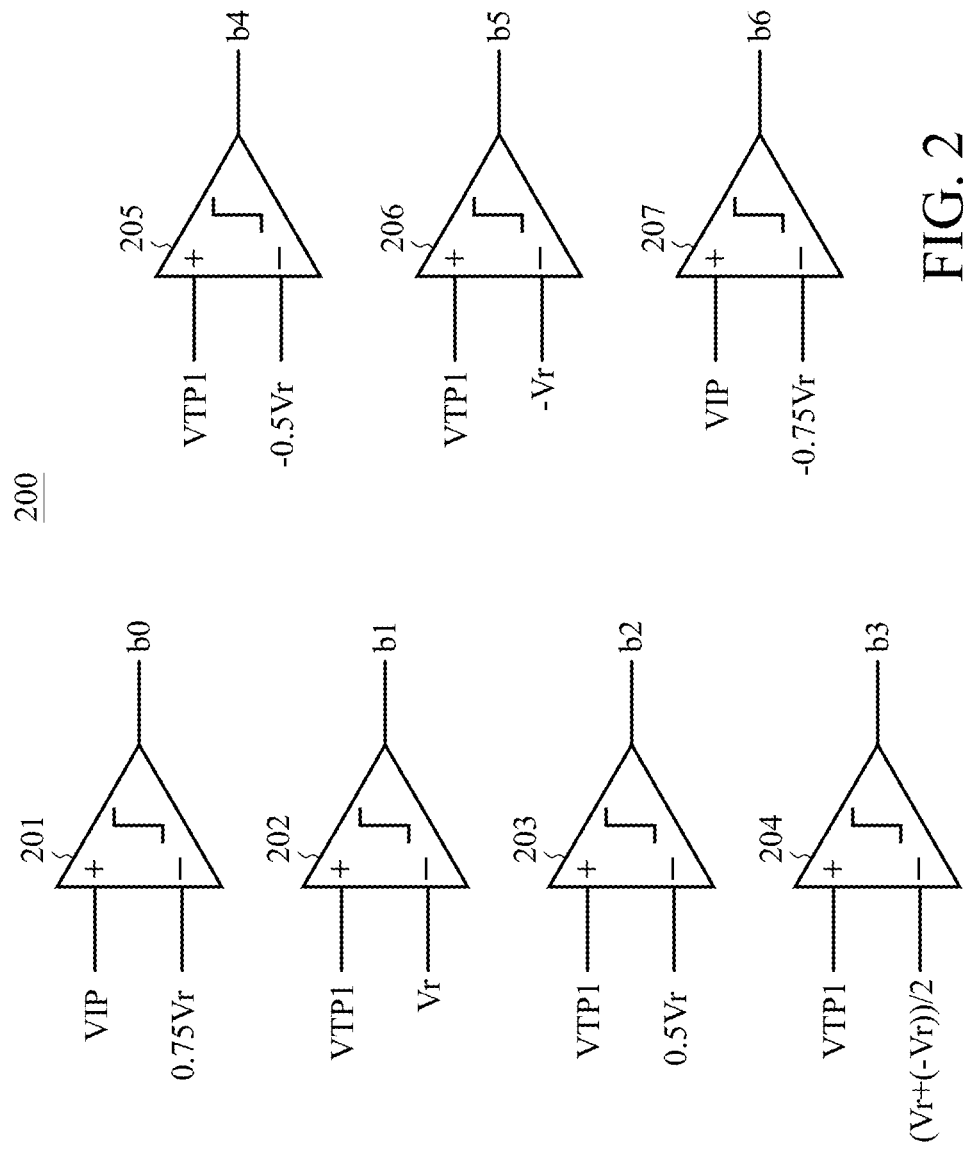
FIG. 2 is a circuit diagram of a quantizer according to an embodiment of the present invention.

FIG. 2 is a circuit diagram of a quantizer according to an embodiment of the present invention. The quantizer 200 includes a comparator 201, a comparator 202, a comparator 203, a comparator 204, a comparator 205, a comparator 206, and a comparator 207. Vr is a direct current (DC) reference voltage.

The comparator 201 compares 0.75 Vr with the input signal VIP to generate the bit b0.

The comparator 202 compares Vr with the intermediate voltage VTP1 to generate the bit b1.

The comparator 203 compares 0.5 Vr with the intermediate voltage VTP1 to generate the bit b2.

The comparator 204 compares the intermediate voltage between Vr and −Vr (i.e., (Vr+(−Vr))/2) with the intermediate voltage VTP1 to generate the bit b3.

The comparator 205 compares −0.5 Vr with the intermediate voltage VTP1 to generate the bit b4.

The comparator 206 compares −Vr with the intermediate voltage VTP1 to generate the bit b5.

The comparator 207 compares −0.75 Vr with the input signal VIP to generate the bit b6.

Note that the number of comparators in FIG. 2 is for illustration purposes only and is not a limitation of the scope of the invention. In other embodiments, the quantizer 200 may include more or fewer comparators.

In some embodiments, the quantizer 105 of FIG. 1 may be embodied by the quantizer 200 (i.e., the digital signal Dout comprises bits b0-b6, with b0 as the most significant bit (MSB) and b6 as the least significant bit (LSB)). In other words, the quantizer 105 includes a plurality of comparators.

Figure 3:
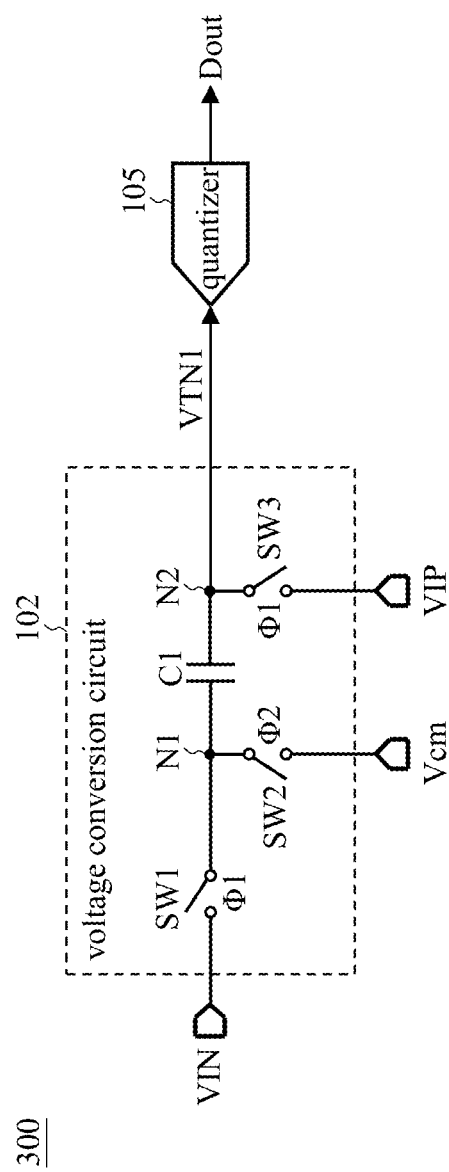
FIG. 3 is a circuit diagram of an ADC according to another embodiment of the present invention.

FIG. 3 is a circuit diagram of an ADC according to another embodiment of the present invention. The ADC 300 is similar to the ADC 100 except that in the embodiment of FIG. 3, the switch SW1 receives the input signal VIN (instead of the input signal VIP), and the switch SW3 receives the input signal VIP (instead of the input signal VIN). Therefore, the intermediate voltage VTN1 is equal to Vcm+2 dV. In other words, because the quantizer 105 substantially quantizes twice the signal component of the differential signal pair, the resolution and SNR of the ADC 300 can be improved.

Figure 4:
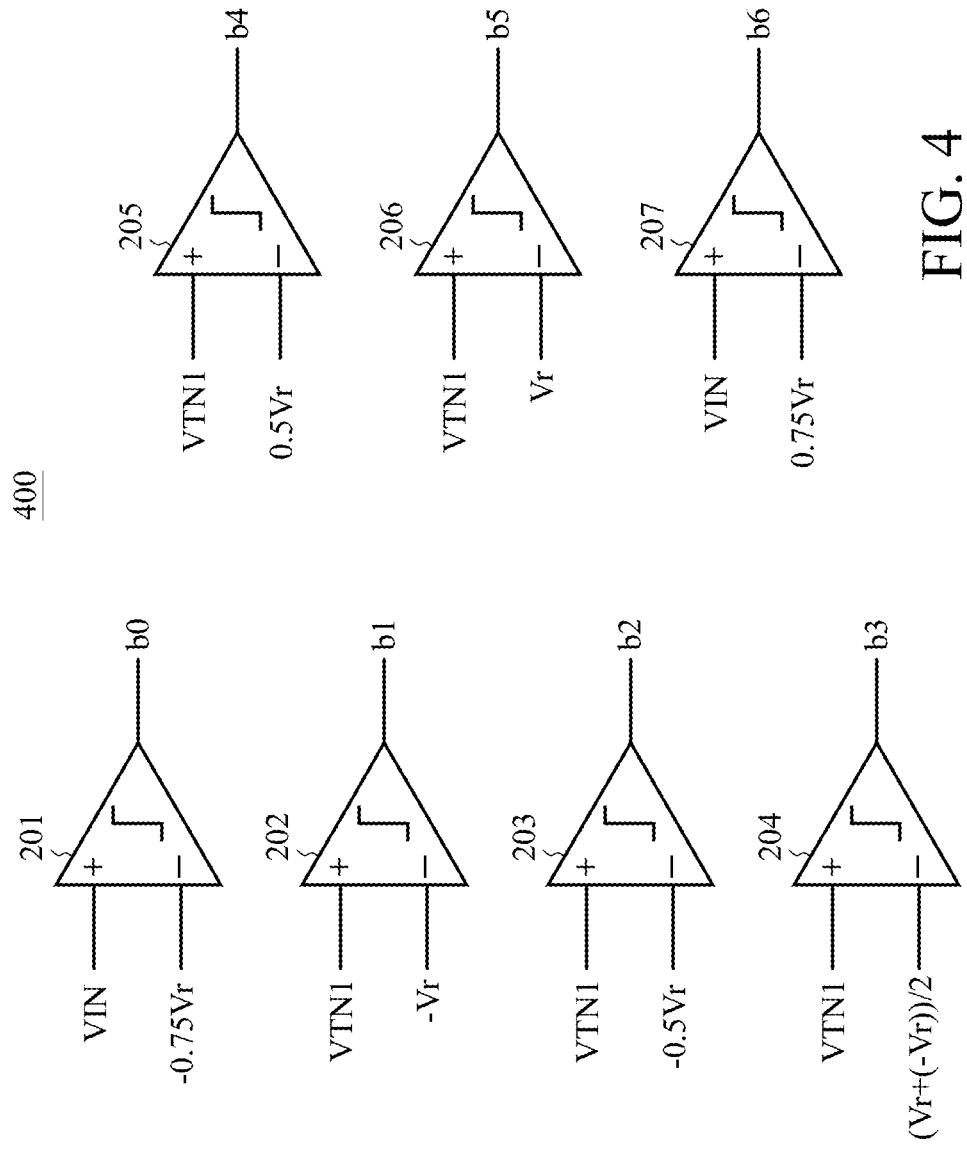
FIG. 4 is a circuit diagram of a quantizer according to another embodiment of the present invention.

FIG. 4 is a circuit diagram of the quantizer according to another embodiment of the present invention. The quantizer 400 is similar to the quantizer 200 except that FIG. 2 corresponds to FIG. 1, and FIG. 4 corresponds to FIG. 3 (i.e., the quantizer 105 of FIG. 3 may be embodied by the quantizer 400); therefore, the input signals of the comparators 201 to 207 must be adjusted accordingly. People having ordinary skill in the art can understand the details of FIG. 4 based on the discussion of FIG. 2, so the details shall be omitted for brevity.

FIGS. 1 to 4 can collectively form a fully differential ADC.

Figure 5:
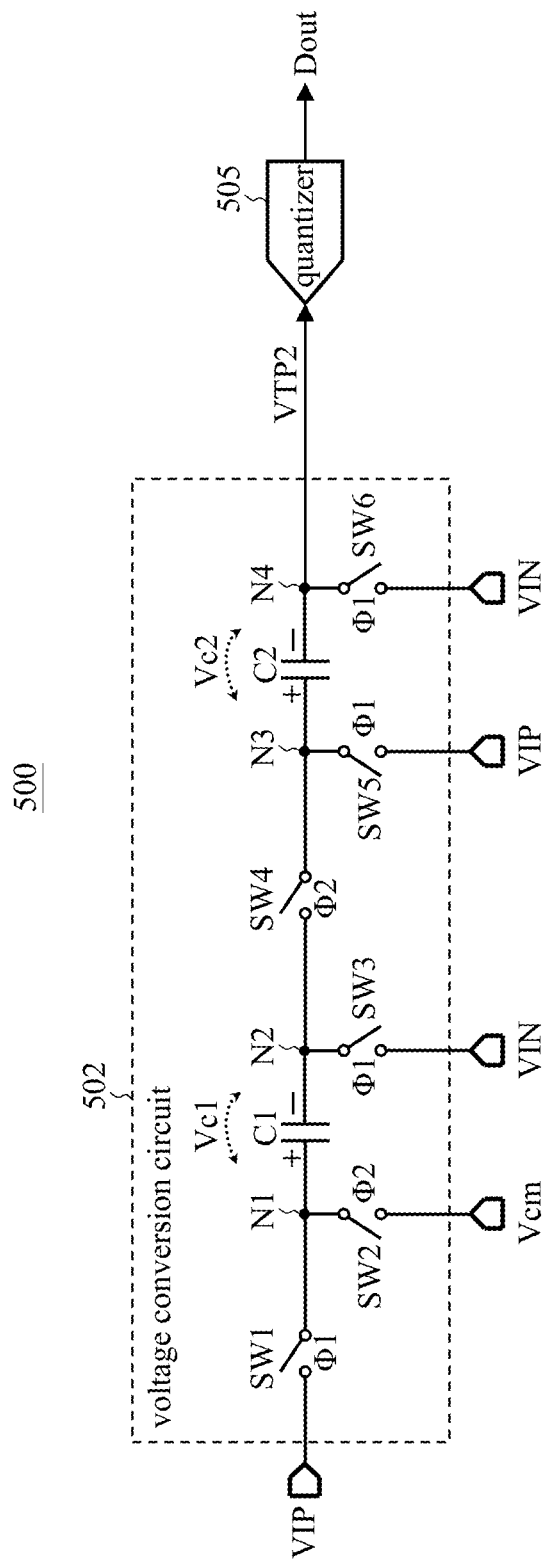
FIG. 5 is a circuit diagram of an ADC according to another embodiment of the present invention.

FIG. 5 is a circuit diagram of an ADC according to another embodiment of the present invention. The ADC 500 includes a voltage conversion circuit 502 and a quantizer 505. The voltage conversion circuit 502 includes a capacitor C1, a capacitor C2, a switch SW1, a switch SW2, a switch SW3, a switch SW4, a switch SW5, and a switch SW6. The two terminals of the capacitor C1 are the node N1 and the node N2 respectively. The two terminals of the capacitor C2 are the node N3 and the node N4 respectively.

One terminal of the switch SW1 receives the input signal VIP; the other terminal of the switch SW1 is coupled or electrically connected to the node N1.

One terminal of the switch SW2 receives the common-mode voltage Vcm; the other terminal of the switch SW2 is coupled or electrically connected to the node N1.

One terminal of the switch SW3 receives the input signal VIN; the other terminal of the switch SW3 is coupled or electrically connected to the node N2.

One terminal of the switch SW4 is coupled or electrically connected to the node N2; the other terminal of the switch SW4 is coupled or electrically connected to the node N3.

One terminal of the switch SW5 receives the input signal VIP; the other terminal of the switch SW5 is coupled or electrically connected to the node N3.

One terminal of the switch SW6 receives the input signal VIN; the other terminal of the switch SW6 is coupled or electrically connected to the node N4.

The input terminal of the quantizer 505 is coupled or electrically connected to the node N4. The quantizer 505 generates the digital signal Dout according to at least the intermediate voltage VTP2 at the node N4.

The ADC 500 operates according to a clock. In the first phase of the clock (e.g., high level), the switches SW1, SW3, SW5, and SW6 are turned on, and the switches SW2 and SW4 are turned off, so that the voltage Vc1 across the capacitor C1 and the voltage Vc2 across the capacitor C2 are both VIP−VIN=2 dV.

In the second phase of the clock (e.g., low level), the switches SW1, SW3, SW5, and SW6 are turned off, and the switches SW2 and SW4 are turned on, so that the intermediate voltage VTP2 at the node N4 becomes Vcm−4 dV. As a result, the quantizer 505 substantially quantizes four times the signal component (i.e., the voltage difference dV) of the differential signal pair; therefore, the resolution and SNR of the ADC 500 can be improved.

Figure 6:
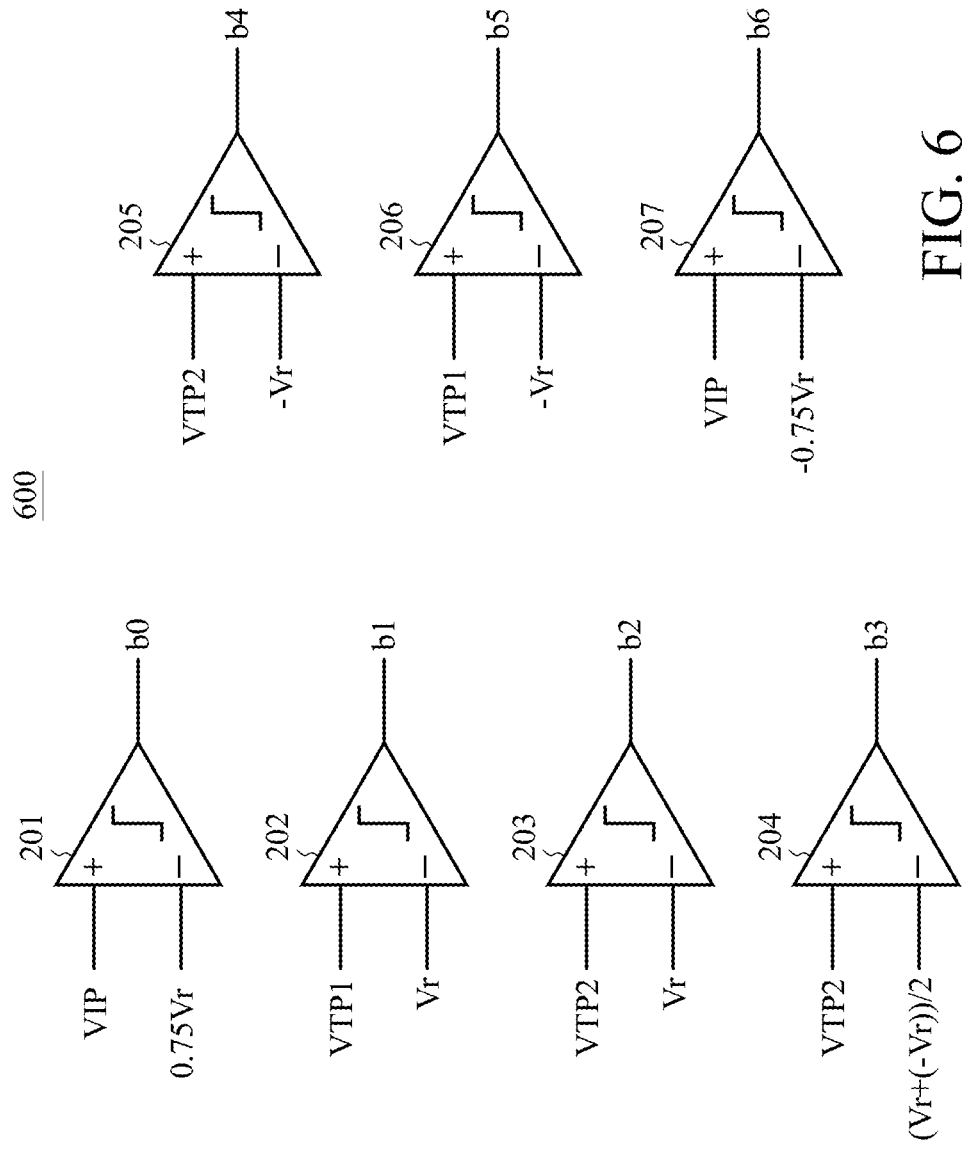
FIG. 6 is a circuit diagram of a quantizer according to another embodiment of the present invention.

FIG. 6 is a circuit diagram of a quantizer according to another embodiment of the present invention. The quantizer 600 is similar to the quantizer 200 except that the comparator 203 generates the bit b2 according to the intermediate voltage VTP2 and the reference voltage Vr, the comparator 204 generates the bit b3 according to the intermediate voltage VTP2 and (Vr+(−Vr))/2, and the comparator 205 generates the bit b4 according to the intermediate voltage VTP2 and −Vr.

In some embodiments, the quantizer 505 of FIG. 5 may be embodied by the quantizer 600. In other words, the quantizer 505 includes a plurality of comparators.

Figure 7:
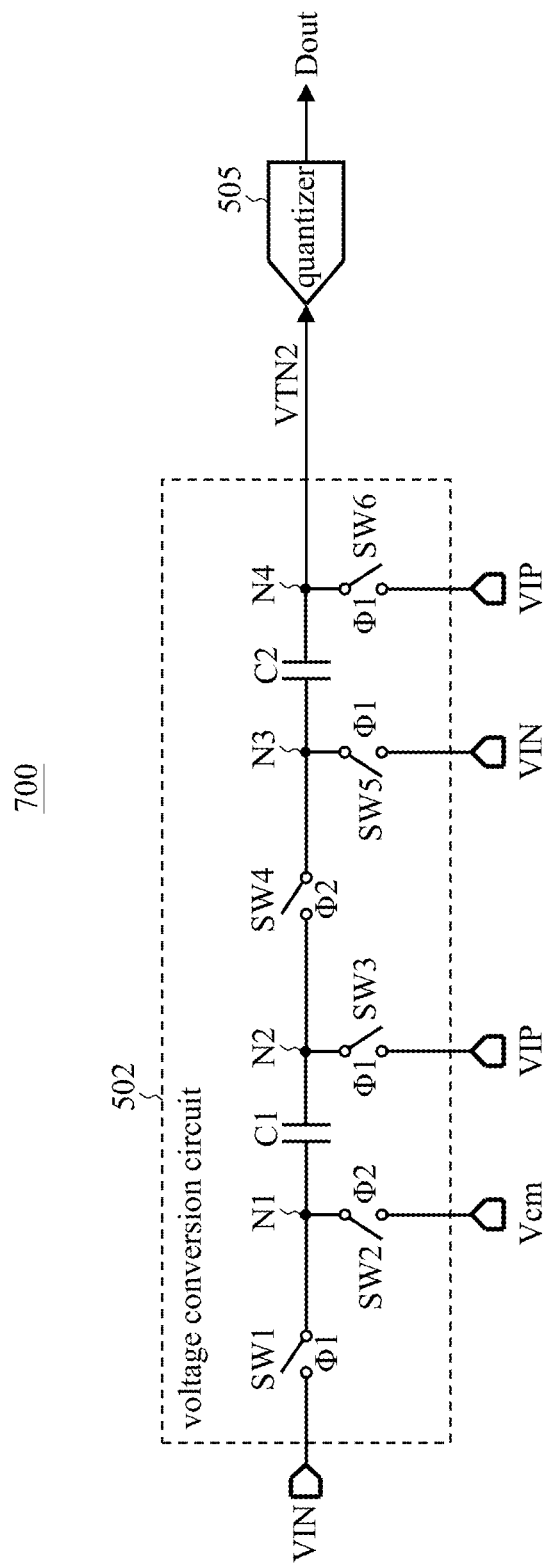
FIG. 7 is a circuit diagram of an ADC according to another embodiment of the present invention.

FIG. 7 is a circuit diagram of an ADC according to another embodiment of the present invention. The ADC 700 is similar to the ADC 500 except that in the embodiment of FIG. 7, the switch SW1 receives the input signal VIN (instead of the input signal VIP), the switch SW3 receives the input signal VIP (instead of the input signal VIN), the switch SW5 receives the input signal VIN (instead of the input signal VIP), and the switch SW6 receives the input signal VIP (instead of the input signal VIN). Therefore, the intermediate voltage VTN2 is equal to Vcm+4 dV. In other words, because the quantizer 505 substantially quantizes four times the signal component of the differential signal pair, the resolution and SNR of the ADC 700 can be improved.

Figure 8:
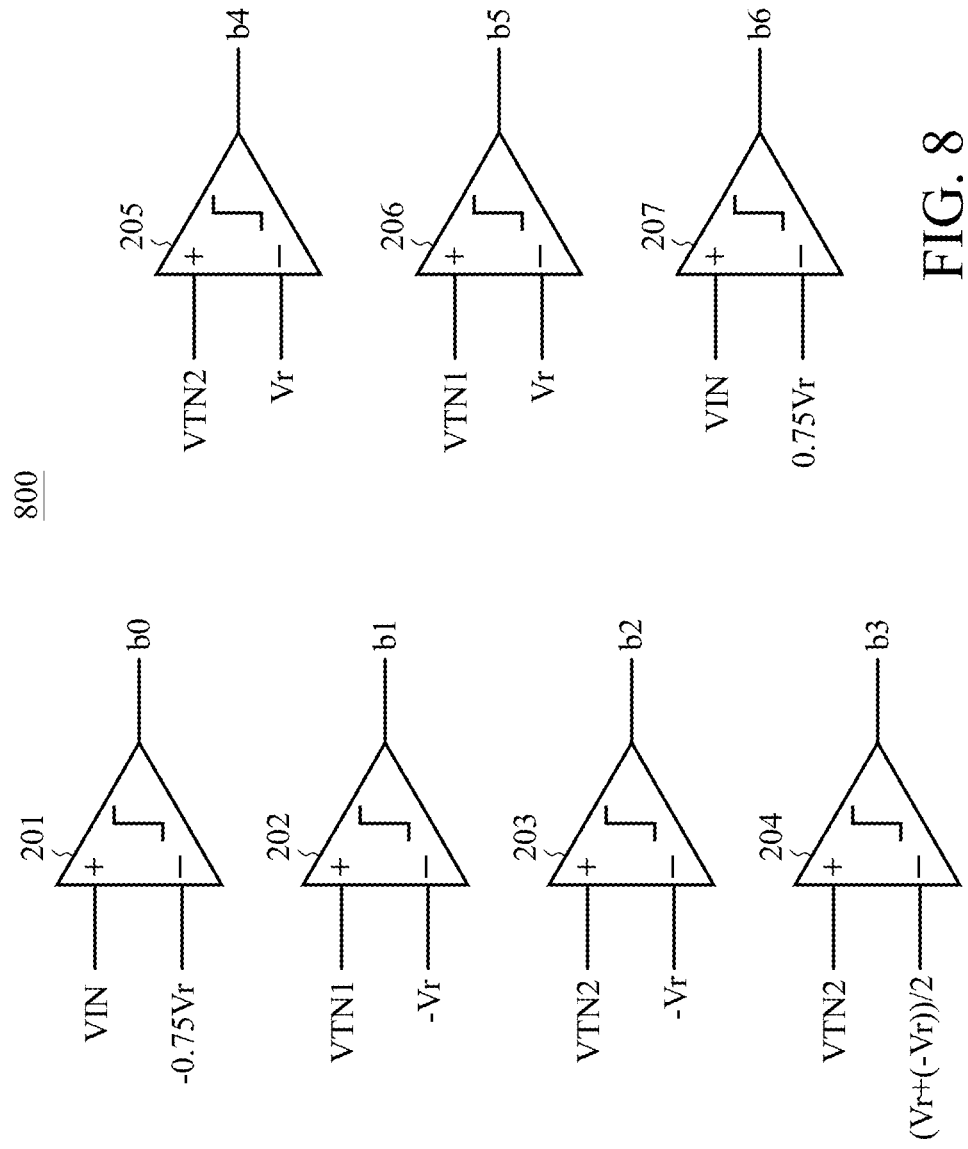
FIG. 8 is a circuit diagram of a quantizer according to another embodiment of the present invention.

FIG. 8 is a circuit diagram of a quantizer according to another embodiment of the present invention. The quantizer 800 is similar to the quantizer 600 except that FIG. 6 corresponds to FIG. 5, and FIG. 8 corresponds to FIG. 7 (i.e., the quantizer 505 of FIG. 7 may be embodied by the quantizer 800); therefore, the input signals of the comparators 201 to 207 must be adjusted accordingly. People having ordinary skill in the art can understand the details of FIG. 8 based on the discussion of FIG. 6, so the details shall be omitted for brevity.

Figure 9:
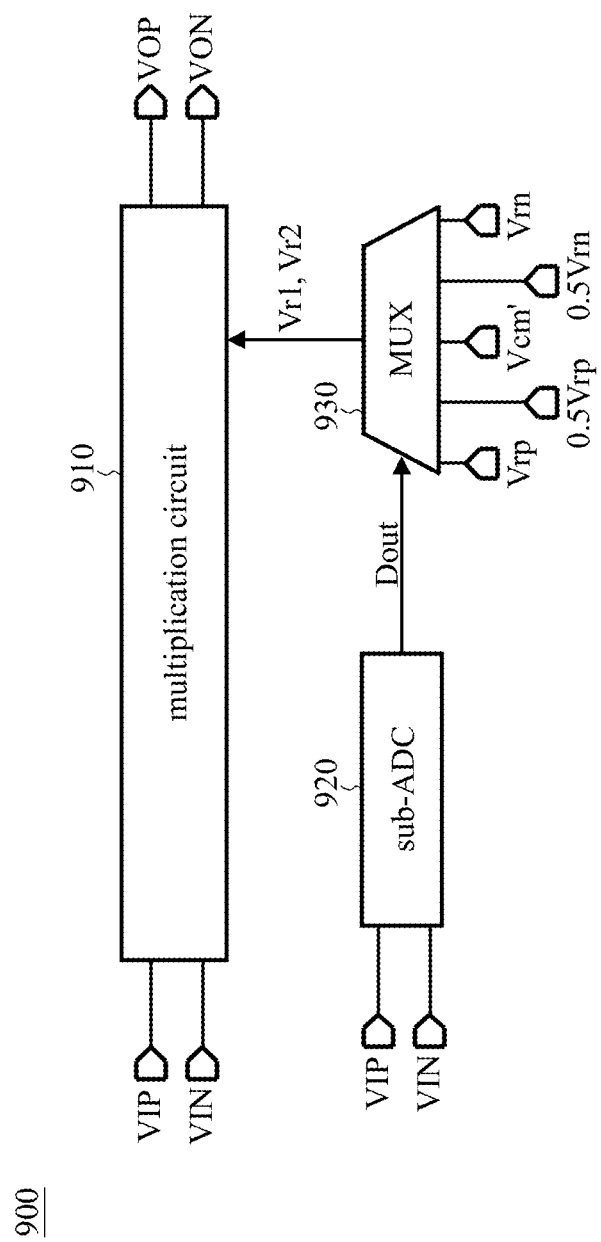
FIG. 9 is a functional block diagram of an operation stage of a pipeline ADC according to an embodiment of the present invention.

The aforementioned ADCs 100, 300, 500, and 700 can be used in an operation stage of a pipeline ADC. Reference is made to FIG. 9, which is a functional block diagram of an operation stage of a pipeline ADC according to an embodiment of the present invention. The operation stage 900 of a pipeline ADC has a first input terminal (i.e., the terminal that receives the input signal VIP), a second input terminal (i.e., the terminal that receives the input signal VIN), a first output terminal (i.e., the terminal that outputs the output signal VOP), and a second output terminal (i.e., the terminal that outputs the output signal VON), and includes a multiplication circuit 910, a sub-ADC 920, and a multiplexer (MUX) 930. The sub-ADC 920 may be embodied by the ADC 100, the ADC 300, the ADC 500, or the ADC 700.

The sub-ADC 920 generates the digital signal Dout according to the input signal VIP and the input signal VIN. The multiplexer 930 determines the reference voltage Vr1 and the reference voltage Vr2 from a plurality of candidate voltages according to the digital signal Dout. These candidate voltages include, but are not limited to, the reference voltage Vrp, the reference voltage Vrn, 0.5 Vrp, 0.5 Vrn, and Vcm'. Here, Vcm' may represent the common-mode voltage of the reference voltage Vrp and the reference voltage Vrn. The multiplication circuit 910 generates the output signal VOP and the output signal VON according to the input signal VIP, the input signal VIN, the reference voltage Vr1, and the reference voltage Vr2. The reference voltage Vr1 and the reference voltage Vr2 are reference voltages that define the input range of the multiplication circuit 910. As the operating principles of the operation stage 900 of a pipeline ADC are well known to people having ordinary skill in the art, the details are omitted for brevity.

When the ADC of the present invention is used as the sub-ADC 920 of the operation stage 900 of the pipeline ADC, the ADC of the present invention uses fewer reference voltages than the sub-ADC of the related art. In other words, the operation stage 900 of the pipeline ADC of the present invention has at least the following advantages: (1) the resolution and SNR of the sub-ADC 920 are relatively high; and (2) the circuit is relatively simple (because of the simplified voltage divider circuit (not shown)).

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An operation stage of a pipeline analog-to-digital converter (pipeline ADC), wherein the operation stage is configured to generate a first output signal and a second output signal according to a first input signal and a second input signal, the first input signal is a common-mode voltage plus a voltage difference, and the second input signal is the common-mode voltage minus the voltage difference, the operation stage comprising:
   a voltage conversion circuit configured to generate an intermediate voltage according to the first input signal, the second input signal, and the common-mode voltage;
   a plurality of comparators configured to compare the intermediate voltage with N times a first reference voltage to generate a digital signal, wherein N is greater than or equal to negative one and less than or equal to one;
   a multiplexer coupled to the comparators and configured to generate a second reference voltage and a third reference voltage according to the digital signal; and
   a multiplication circuit configured to generate the first output signal and the second output signal according to the first input signal, the second input signal, the second reference voltage, and the third reference voltage;
   wherein the intermediate voltage is the common-mode voltage plus M times the voltage difference or the common-mode voltage minus M times the voltage difference, M is two to the power of R, and R is a positive integer.

2. The operation stage of claim 1, wherein the comparators compare the intermediate voltage with the first reference voltage and compare the intermediate voltage with a negative value of the first reference voltage.

3. The operation stage of claim 2, wherein M is equal to two, and the voltage conversion circuit comprises:
a capacitor having a first terminal and a second terminal;
a first switch having a third terminal and a fourth terminal, wherein the third terminal receives one of the first input signal and the second input signal, and the fourth terminal is coupled to the first terminal;
a second switch having a fifth terminal and a sixth terminal, wherein the fifth terminal is coupled to the first terminal, and the sixth terminal receives the common-mode voltage; and
a third switch having a seventh terminal and an eighth terminal, wherein the seventh terminal is coupled to the second terminal, and the eighth terminal receives another one of the first input signal and the second input signal.

4. The operation stage of claim 3, wherein when a clock is at a first level, the first switch is turned on, the second switch is turned off, and the third switch is turned on; when the clock is at a second level, the first switch is turned off, the second switch is turned on, and the third switch is turned off.

5. The operation stage of claim 2, wherein M is equal to two, and the voltage conversion circuit comprises:
a first capacitor having a first terminal and a second terminal;
a first switch having a third terminal and a fourth terminal, wherein the third terminal receives the first input signal, and the fourth terminal is coupled to the first terminal;
a second switch having a fifth terminal and a sixth terminal, wherein the fifth terminal is coupled to the first terminal, and the sixth terminal receives the common-mode voltage; and
a third switch having a seventh terminal and an eighth terminal, wherein the seventh terminal is coupled to the second terminal, and the eighth terminal receives the second input signal;
a second capacitor having a ninth terminal and a tenth terminal;
a fourth switch having an eleventh terminal and a twelfth terminal, wherein the eleventh terminal receives the second input signal, and the twelfth terminal is coupled to the ninth terminal;
a fifth switch having a thirteenth terminal and a fourteenth terminal, wherein the thirteenth terminal is coupled to the ninth terminal, and the fourteenth terminal receives the common-mode voltage; and
a sixth switch having a fifteenth terminal and a sixteenth terminal, wherein the fifteenth terminal is coupled to the second terminal, and the sixteenth terminal receives the first input signal.

6. The operation stage of claim 5, wherein when a clock is a first level, the first switch is turned on, the second switch is turned off, the third switch is turned on, the fourth switch is turned on, the fifth switch is turned off, and the sixth switch is turned on; when the clock is at a second level, the first switch is turned off, the second switch is turned on, the third switch is turned off, the fourth switch is turned off, the fifth switch is turned on, and the sixth switch is turned off.

7. The operation stage of claim 2, wherein M is equal to four, and the voltage conversion circuit comprises:
a first capacitor having a first terminal and a second terminal;
a second capacitor having a third terminal and a fourth terminal;
a first switch having a fifth terminal and a sixth terminal, wherein the fifth terminal receives a first signal, and the sixth terminal is coupled to the first terminal;
a second switch having a seventh terminal and an eighth terminal, wherein the seventh terminal is coupled to the first terminal, and the eighth terminal receives the common-mode voltage;
a third switch having a ninth terminal and a tenth terminal, wherein the ninth terminal is coupled to the second terminal, and the tenth terminal receives a second signal;
a fourth switch having an eleventh terminal and a twelfth terminal, wherein the eleventh terminal is coupled to the second terminal, and the twelfth terminal is coupled to the third terminal;
a fifth switch having a thirteenth terminal and a fourteenth terminal, wherein the thirteenth terminal is coupled to the third terminal, and the fourteenth terminal receives the first signal; and
a sixth switch having a fifteenth terminal and a sixteenth terminal, wherein the fifteenth terminal is coupled to the fourth terminal, and the sixteenth terminal receives the second signal;
wherein the first signal is one of the first input signal and the second input signal, and the second signal is another one of the first input signal and the second input signal.

8. The operation stage of claim 7, wherein when a clock is at a first level, the first switch is turned on, the second switch is turned off, the third switch is turned on, the fourth switch is turned off, the fifth switch is turned on, and the sixth switch is turned on; when the clock is at a second level, the first switch is turned off, the second switch is turned on, the third switch is turned off, the fourth switch is turned on, the fifth switch is turned off, and the sixth switch is turned off.

9. An analog-to-digital converter (ADC), wherein the ADC is configured to receive a first input signal and a second input signal and output a digital signal, the first input signal is a common-mode voltage plus a voltage difference, and the second input signal is the common-mode voltage minus the voltage difference, the ADC comprising:
a voltage conversion circuit configured to generate an intermediate voltage according to the first input signal, the second input signal, and the common-mode voltage; and
a plurality of comparators configured to compare the intermediate voltage with N times a reference voltage, wherein N is greater than or equal to negative one and less than or equal to one;
wherein the intermediate voltage is the common-mode voltage plus M times the voltage difference or the common-mode voltage minus M times the voltage difference, M is two to the power of R, and R is a positive integer.

10. The ADC of claim 9, wherein the comparators compare the intermediate voltage with the reference voltage and compare the intermediate voltage with a negative value of the reference voltage.

11. The ADC of claim 10, wherein M is equal to two, and the voltage conversion circuit comprises:
a capacitor having a first terminal and a second terminal;
a first switch having a third terminal and a fourth terminal, wherein the third terminal receives one of the first input signal and the second input signal, and the fourth terminal is coupled to the first terminal;

a second switch having a fifth terminal and a sixth terminal, wherein the fifth terminal is coupled to the first terminal, and the sixth terminal receives the common-mode voltage; and a third switch having a seventh terminal and an eighth terminal, wherein the seventh terminal is coupled to the second terminal, and the eighth terminal receives another one of the first input signal and the second input signal.

12. The ADC of claim 11, wherein when a clock is a first level, the first switch is turned on, the second switch is turned off, and the third switch is turned on; when the clock is at a second level, the first switch is turned off, the second switch is turned on, and the third switch is turned off.

13. The ADC of claim 10, wherein M is equal to two, and the voltage conversion circuit comprises:

a first capacitor having a first terminal and a second terminal;

a first switch having a third terminal and a fourth terminal, wherein the third terminal receives the first input signal, and the fourth terminal is coupled to the first terminal;

a second switch having a fifth terminal and a sixth terminal, wherein the fifth terminal is coupled to the first terminal, and the sixth terminal receives the common-mode voltage; and a third switch having a seventh terminal and an eighth terminal, wherein the seventh terminal is coupled to the second terminal, and the eighth terminal receives the second input signal;

a second capacitor having a ninth terminal and a tenth terminal;

a fourth switch having an eleventh terminal and a twelfth terminal, wherein the eleventh terminal receives the second input signal, and the twelfth terminal is coupled to the ninth terminal;

a fifth switch having a thirteenth terminal and a fourteenth terminal, wherein the thirteenth terminal is coupled to the ninth terminal, and the fourteenth terminal receives the common-mode voltage; and a sixth switch having a fifteenth terminal and a sixteenth terminal, wherein the fifteenth terminal is coupled to the second terminal, and the sixteenth terminal receives the first input signal.

14. The ADC of claim 13, wherein when a clock is a first level, the first switch is turned on, the second switch is turned off, the third switch is turned on, the fourth switch is turned on, the fifth switch is turned off, and the sixth switch is turned on; when the clock is at a second level, the first switch is turned off, the second switch is turned on, the third switch is turned off, the fourth switch is turned off, the fifth switch is turned on, and the sixth switch is turned off.

15. The ADC of claim 10, wherein M is equal to four, and the voltage conversion circuit comprises:

a first capacitor having a first terminal and a second terminal;

a second capacitor having a third terminal and a fourth terminal;

a first switch having a fifth terminal and a sixth terminal, wherein the fifth terminal receives a first signal, and the sixth terminal is coupled to the first terminal;

a second switch having a seventh terminal and an eighth terminal, wherein the seventh terminal is coupled to the first terminal, and the eighth terminal receives the common-mode voltage;

a third switch having a ninth terminal and a tenth terminal, wherein the ninth terminal is coupled to the second terminal, and the tenth terminal receives a second signal;

a fourth switch having an eleventh terminal and a twelfth terminal, wherein the eleventh terminal is coupled to the second terminal, and the twelfth terminal is coupled to the third terminal;

a fifth switch having a thirteenth terminal and a fourteenth terminal, wherein the thirteenth terminal is coupled to the third terminal, and the fourteenth terminal receives the first signal; and a sixth switch having a fifteenth terminal and a sixteenth terminal, wherein the fifteenth terminal is coupled to the fourth terminal, and the sixteenth terminal receives the second signal;

wherein the first signal is one of the first input signal and the second input signal, and the second signal is another one of the first input signal and the second input signal.

16. The ADC of claim 15, wherein when a clock is at a first level, the first switch is turned on, the second switch is turned off, the third switch is turned on, the fourth switch is turned off, the fifth switch is turned on, and the sixth switch is turned on; when the clock is at a second level, the first switch is turned off, the second switch is turned on, the third switch is turned off, the fourth switch is turned on, the fifth switch is turned off, and the sixth switch is turned off.

* * * * *